United States Patent
Yu et al.

(10) Patent No.: US 9,159,280 B1
(45) Date of Patent: Oct. 13, 2015

(54) GOA CIRCUIT FOR LIQUID CRYSTAL DISPLAYING AND DISPLAY DEVICE

(71) Applicant: Shenzhen China Star Optoelectronics Technology Co., Ltd., Shenzhen, Guangdong (CN)

(72) Inventors: Xiaojiang Yu, Guangdong (CN); Changyeh Lee, Guangdong (CN); Tzuchieh Lai, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 57 days.

(21) Appl. No.: 14/345,759

(22) PCT Filed: Jan. 3, 2014

(86) PCT No.: PCT/CN2014/070115
§ 371 (c)(1),
(2) Date: Mar. 19, 2014

(87) PCT Pub. No.: WO2015/089914
PCT Pub. Date: Jun. 25, 2015

(51) Int. Cl.
G09G 3/36 (2006.01)
G02F 1/133 (2006.01)
G02F 1/1345 (2006.01)

(52) U.S. Cl.
CPC .......... G09G 3/3607 (2013.01); G02F 1/13306 (2013.01); G02F 1/13454 (2013.01);
(Continued)

(58) Field of Classification Search
CPC .............. G09G 3/3607; G09G 2300/0809; G09G 2310/0248; G09G 2320/0242; G09G 2320/0252; G09G 3/3688; G09G 3/3677; G09G 3/3648; G09G 2310/027; G02F 1/13306; G02F 1/13454; G11C 19/28
USPC .................. 345/87–100, 204–214, 690–699; 377/77–80
See application file for complete search history.

(56) References Cited

U.S. PATENT DOCUMENTS

2008/0219401 A1* 9/2008 Tobita .............................. 377/79
2010/0097368 A1 4/2010 Hwang
(Continued)

FOREIGN PATENT DOCUMENTS

| CN | 101552040 A | 10/2009 |
| CN | 102226940 A | 10/2011 |

(Continued)

*Primary Examiner* — Dmitriy Bolotin
(74) *Attorney, Agent, or Firm* — Andrew C. Cheng

(57) ABSTRACT

The present invention relates to a GOA circuit for liquid crystal displaying and a display device. The GOA circuit includes a plurality of cascaded GOA units and the nth-stage GOA unit includes a pull-up part (100), a key pull-down part (200), a pull-down holding part (300), a pull-up control part (400), and a boost capacitor (Cb). In operation, a nth-stage clock signal (CK(n)) and first and second clock signals (LC1 and LC2) are inputted. The frequencies of the first clock signal (LC1) and the second clock signal (LC2) are lower than the nth clock signal (CK(n)). The first clock signal (LC1) charging a first circuit point (P) and the second clock signal (LC2) charging a second circuit point (K) are alternately carried out. The present invention also provides a corresponding display device. The GOA circuit of the present invention precisely controls the voltage of the gate Q(n) that affects charging of a horizontal scan line by means of the low frequency clock signal and the high frequency clock signal, so as to ensure a stable output of the GOA charging signal.

15 Claims, 4 Drawing Sheets

(52) U.S. Cl.
CPC ............ *G09G3/3648* (2013.01); *G09G 3/3677* (2013.01); *G09G 3/3688* (2013.01); *G09G 2300/0809* (2013.01); *G09G 2310/027* (2013.01); *G09G 2310/0248* (2013.01); *G09G 2320/0242* (2013.01); *G09G 2320/0252* (2013.01)

(56) References Cited

U.S. PATENT DOCUMENTS

| | | | |
|---|---|---|---|
| 2010/0150302 A1* | 6/2010 | Tsai et al. | 377/79 |
| 2010/0158188 A1* | 6/2010 | Lee et al. | 377/79 |
| 2011/0285697 A1* | 11/2011 | Lee et al. | 345/419 |
| 2015/0043703 A1* | 2/2015 | Tan et al. | 377/68 |
| 2015/0187302 A1* | 7/2015 | Dai | 377/79 |

FOREIGN PATENT DOCUMENTS

| | | |
|---|---|---|
| CN | 102651187 A | 8/2012 |
| CN | 103310755 A | 9/2013 |
| KR | 20130062127 A | 6/2013 |
| TW | 201123728 A | 7/2011 |

* cited by examiner

GOA CIRCUIT FOR LIQUID CRYSTAL DISPLAYING AND DISPLAY DEVICE

BACKGROUND OF THE INVENTION

1. Field of the Invention

The present invention relates to the field of liquid crystal displaying technology, and in particular to a GOA (Gate Driver on Array) circuit for liquid crystal displaying and a display device.

2. the Related Arts

Liquid crystal displays have many advantages, such as thin device body, power saving, and being free of radiation and are widely used. The existing liquid crystal displays on the market are mostly backlight type liquid crystal displays, which comprise a liquid crystal panel and a backlight module. The operation principle of the liquid crystal panel is to place liquid crystal molecules between two parallel glass substrates and applying a driving voltage to the two glass substrates to control the rotating direction of the liquid crystal molecules, in order to refract the light of the backlight module out to generate an image.

In an active liquid crystal display, each pixel has a thin film transistor (TFT) having a gate connected with a horizontal scan line, a drain connected with a vertical data line, and a source connected with a pixel electrode. Applying a sufficient voltage on the horizontal scan line can turn on all of the TFTs on this line, and at this time, the pixel electrodes of the horizontal scan line are connected with the vertical data line, thereby writing a display signal of the data line to the pixels to control the transmittance of different liquid crystal thereby achieving an effect of controlling color. The driving of the horizontal scan line of the conventional active liquid crystal display panel is provided by an external IC (Integrated Circuit). The external IC can control charging and discharging of each stage horizontal scan line in stage by stage manner. However, GOA technology, which refers to Gate Driver on Array technology, can utilize an existing manufacturing process of a liquid crystal display panel to form a driving circuit of the horizontal scan line on the substrate surrounding a display region, making it accomplish driving of the horizontal scan line to replace the external IC. The GOA technology can reduce the process of bonding the external IC, making it possible to improve the productivity and reducing the cost, and moreover, it can make the liquid crystal display panel more suitable for display products having a slim bezel or no bezel.

An existing GOA circuit generally comprises a plurality of cascaded GOA units and each GOA unit corresponds to a horizontal scan line. A general structure of the GOA unit comprises a pull-up part, a pull-up control part, a transfer part, a key pull-down part, a pull-down holding part, and a boost capacitor for boosting voltage. The pull-up part generally supplies an output of a clock signal as a gate signal; the pull-up control part is responsible for controlling the turn-on time of the pull-up part and is generally connected with a transfer signal or a gate signal transmitted from a previous stage GOA circuit; the key pull-down part is responsible for pulling the gate to a low voltage in a first time point, namely shutting off the gate signal; the pull-down holding part is responsible for holding the gate output signal and the gate signal (commonly referred to as a Q point) of the pull-up part in a turn-off status (namely negative voltage), there being generally two pull-down holding modules operating alternately; and the boost capacitor (C) is responsible for boosting Q point for a second time in order to facilitate outputting of G(N) of the pull-up part.

The purpose of the GOA circuit is to output the scan waveform, which is supplied from an integrated circuit through the circuit operation in order to turn on a pixel switch and thereby supplying a data signal to an ITO (Indium Tin Oxide) electrode. After the data signal has been input, the content of the data signal is held up until a next frame is turned on. During the operation of the circuit, since a scan circuit is set off in the remaining time of a frame after having been turned on, the turn-off (holding) time of the scan circuit is much longer than the scanning time, so that the requirement for the stability of the thin film transistor in the GOA circuit is very high. In order to ensure a stable output of the GOA circuit charging signal, it is extremely desired for a solution that the voltage of the gate Q(n) of the thin film transistor affecting charging of the horizontal scan line in the GOA circuit can be precisely controlled.

SUMMARY OF THE INVENTION

Therefore, a purpose of the present invention is to provide a GOA (Gate Driver on Array) circuit for liquid crystal displaying, which achieves precise control of the voltage of the gate Q(n) of a thin film transistor that affects charging of a horizontal scan line by means of a low frequency clock signal and a high frequency clock signal so as to ensure a stable output of a GOA charging signal.

Another purpose of the present invention is to provide a liquid crystal display device that uses the above GOA circuit to achieve precise control of the voltage of the gate Q(n) of a thin film transistor that affects charging of a horizontal scan line by means of a low frequency clock signal and a high frequency clock signal so as to ensure a stable output of a GOA charging signal.

In order to achieve the above purposes, the present invention provides a GOA circuit for liquid crystal displaying, which comprises a plurality of cascaded GOA units, in which a nth-stage GOA control unit controls charging of a nth-stage horizontal scan line of a display region and the nth-stage GOA unit comprises a pull-up part, a key pull-down part, a pull-down holding part, a pull-up control part, and a boost capacitor, the pull-up part, the key pull-down part, the pull-down holding part, and the boost capacitor being connected with a gate signal point and the nth-stage horizontal scan line, the pull-up control part being connected with the gate signal point;

wherein the key pull-down part comprises:

a first thin film transistor, which has a gate connected with a first circuit point and a drain and a source respectively connected with the nth horizontal scan line and receiving an input of a direct current low voltage;

a second thin film transistor, which has a gate connected with a second circuit point and a drain and a source respectively connected with the nth horizontal scan line and receiving an input of the direct current low voltage;

a third thin film transistor, which has a gate connected with the gate signal point and a drain and a source respectively connected with the first circuit point and receiving an input of the direct current low voltage;

a fourth thin film transistor, which has a gate connected with the gate signal point and a drain and a source respectively connected with the second circuit point and receiving an input of the direct current low voltage;

a fifth thin film transistor, which has a drain and a source respectively connected with the gate signal point and the nth horizontal scan line;

a sixth thin film transistor, which has a drain and a source respectively receiving an input of a nth-stage clock signal and connected with a gate of the fifth thin film transistor;

a seventh thin film transistor, which has a gate receiving an input of a first clock signal and a drain and a source respectively connected with a gate of the sixth thin film transistor and the first circuit point;

an eighth thin film transistor, which has a gate receiving an input of a second clock signal and a drain and a source respectively connected with the gate of the sixth thin film transistor and the second circuit point;

a ninth thin film transistor, which has a gate receiving an input of the first clock signal and a drain and a source respectively receiving an input of the first clock signal and connected with the gate of the sixth thin film transistor; and a tenth thin film transistor, which has a gate receiving an input of the second clock signal and a drain and a source respectively receiving an input of the second clock signal and connected with the gate of the sixth thin film transistor;

whereby in operation, frequencies of the first clock signal and the second clock signal are set lower than the nth clock signal and the first clock signal charging the first circuit point and the second clock signal charging the second circuit point are alternately carried out.

The pull-up part comprises: an eleventh thin film transistor, which has a gate connected with the gate signal point and a drain and a source respectively receiving an input of the nth-stage clock signal and connected with the nth-stage horizontal scan line.

The key pull-down part comprises: a twelfth thin film transistor, which has a gate connected with a (n+2)th-stage horizontal scan line and a drain and a source respectively connected with the nth-stage horizontal scan line and receiving an input of the direct current low voltage; and a thirteenth thin film transistor, which has a gate connected with the (n+2)th-stage horizontal scan line and a drain and a source respectively connected with the gate signal point and receiving an input of the direct current low voltage.

The pull-up control part comprises: a fourteenth thin film transistor, which has a gate connected with a (n−2)th-stage horizontal scan line and a drain and a source respectively connected with the (n−2)th-stage horizontal scan line and the gate signal point.

The nth-stage clock signal has a duty ratio of 40%.

The first clock signal is supplied via a common metal wire to the plurality of cascaded GOA units.

The second clock signal is supplied via a common metal wire to the plurality of cascaded GOA units.

The direct current low voltage signal is supplied via a common metal wire to the plurality of cascaded GOA units.

The present invention also provides a GOA circuit for liquid crystal displaying, which comprises a plurality of cascaded GOA units, in which a nth-stage GOA control unit controls charging of a nth-stage horizontal scan line of a display region and the nth-stage GOA unit comprises a pull-up part, a key pull-down part, a pull-down holding part, a pull-up control part, and a boost capacitor, the pull-up part, the key pull-down part, the pull-down holding part, and the boost capacitor being connected with a gate signal point and the nth-stage horizontal scan line, the pull-up control part being connected with the gate signal point;

wherein the key pull-down part comprises:

a first thin film transistor, which has a gate connected with a first circuit point and a drain and a source respectively connected with the nth horizontal scan line and receiving an input of a direct current low voltage;

a second thin film transistor, which has a gate connected with a second circuit point and a drain and a source respectively connected with the nth horizontal scan line and receiving an input of the direct current low voltage;

a third thin film transistor, which has a gate connected with the gate signal point and a drain and a source respectively connected with the first circuit point and receiving an input of the direct current low voltage;

a fourth thin film transistor, which has a gate connected with the gate signal point and a drain and a source respectively connected with the second circuit point and receiving an input of the direct current low voltage;

a fifth thin film transistor, which has a drain and a source respectively connected with the gate signal point and the nth horizontal scan line;

a sixth thin film transistor, which has a drain and a source respectively receiving an input of a nth-stage clock signal and connected with a gate of the fifth thin film transistor;

a seventh thin film transistor, which has a gate receiving an input of a first clock signal and a drain and a source respectively connected with a gate of the sixth thin film transistor and the first circuit point;

an eighth thin film transistor, which has a gate receiving an input of a second clock signal and a drain and a source respectively connected with the gate of the sixth thin film transistor and the second circuit point;

a ninth thin film transistor, which has a gate receiving an input of the first clock signal and a drain and a source respectively receiving an input of the first clock signal and connected with the gate of the sixth thin film transistor; and a tenth thin film transistor, which has a gate receiving an input of the second clock signal and a drain and a source respectively receiving an input of the second clock signal and connected with the gate of the sixth thin film transistor;

whereby in operation, frequencies of the first clock signal and the second clock signal are set lower than the nth clock signal and the first clock signal charging the first circuit point and the second clock signal charging the second circuit point are alternately carried out;

wherein the pull-up part comprises: an eleventh thin film transistor, which has a gate connected with the gate signal point and a drain and a source respectively receiving an input of the nth-stage clock signal and connected with the nth-stage horizontal scan line; and wherein the key pull-down part comprises: a twelfth thin film transistor, which has a gate connected with a (n+2)th-stage horizontal scan line and a drain and a source respectively connected with the nth-stage horizontal scan line and receiving an input of the direct current low voltage; and a thirteenth thin film transistor, which has a gate connected with the (n+2)th-stage horizontal scan line and a drain and a source respectively connected with the gate signal point and receiving an input of the direct current low voltage.

The pull-up control part comprises: a fourteenth thin film transistor, which has a gate connected with a (n−2)th-stage horizontal scan line and a drain and a source respectively connected with the (n−2)th-stage horizontal scan line and the gate signal point.

The nth-stage clock signal has a duty ratio of 40%.

The first clock signal is supplied via a common metal wire to the plurality of cascaded GOA units.

The second clock signal is supplied via a common metal wire to the plurality of cascaded GOA units.

The direct current low voltage signal is supplied via a common metal wire to the plurality of cascaded GOA units.

The present invention further provides a display device, which comprises a GOA circuit for liquid crystal displaying described above.

The GOA circuit for liquid crystal displaying and the display device according to the present invention can precisely control the voltage of the gate Q(n) of the thin film transistor affecting charging of the horizontal scan line in a charging period and a non-charging period by means of the low frequency clock signal and the high frequency clock signal, thereby ensuring a stable output of the GOA charging signal. Utilizing the GOA circuit of the present invention make it possible to produce a liquid crystal display device having a slim bezel or no bezel with a low cost.

BRIEF DESCRIPTION OF THE DRAWINGS

The following description combines the drawings, through describing in detail the embodiments in the present invention, making the technical solutions and other beneficial effect in the present invention more obvious.

In the drawings.

DETAILED DESCRIPTION OF THE PREFERRED EMBODIMENTS

Figure 1:
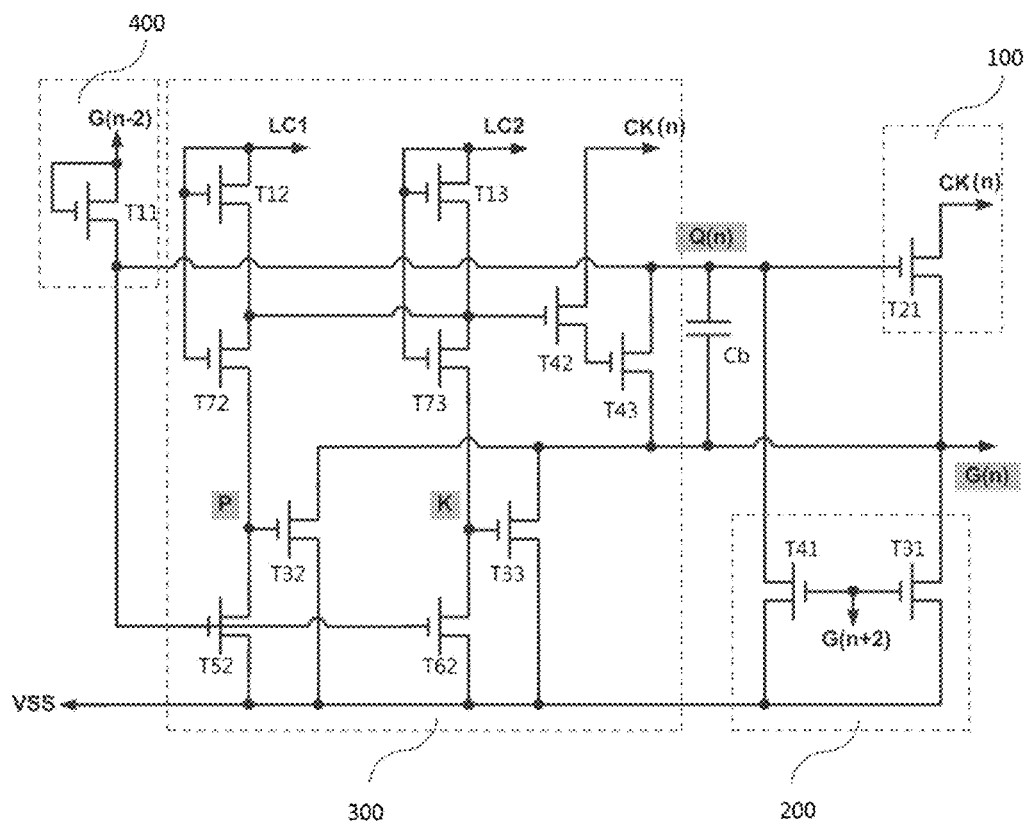
FIG. 1 is a circuit diagram of an embodiment of a GOA circuit (single stage) for liquid crystal displaying according to the present invention.

Referring to FIG. 1, which is a circuit diagram of an embodiment of a GOA circuit (single stage) for liquid crystal displaying according to the present invention, the GOA circuit of the present invention comprises a plurality of cascaded GOA units, in which an nth-stage GOA control unit controls charging of a nth-stage horizontal scan line G(n) of a display region and the nth-stage GOA unit comprises a pull-up part 100, a key pull-down part 200, a pull-down holding part 300, a pull-up control part 400, and a boost capacitor Cb. The pull-up part 100, the key pull-down part 200, the pull-down holding part 300, and the boost capacitor Cb are connected with a gate signal point Q(n) and the nth-stage horizontal scan line G(n). The pull-up control part 400 is connected with the gate signal point Q(n).

The pull-up part 100 comprises a thin film transistor T21 that directly controls charging to the nth-stage horizontal scan line G(n) of the display region and has a gate connected with the gate signal point Q(n). A drain and a source of T21 are respectively connected to a nth-stage high-frequency clock signal CK(n) and the nth-stage horizontal scan line G(n). The voltage of the gate of T21 directly affects CK(n) charging G(n).

The key pull-down part 200 comprises a group of thin film transistors for discharging at the time when the charging of G(n) ends and comprises T31 for discharging G(n) and T41 for discharging Q(n). The transistor T31 has a gate connected with a (n+2)th-stage horizontal scan line G(n+2) and a drain and a source respectively connected with the nth-stage horizontal scan line G(n) and receiving an input of a direct current low voltage VSS. The transistor T41 has a gate connected with the (n+2)th-stage horizontal scan line G(n+2) and a drain and a source respectively connected with the gate signal point Q(n) and receiving an input of the direct current low voltage VSS.

The pull-up control part 400 comprises a thin film transistor T11, which has a gate connected with the (n−2)th-stage horizontal scan line G(n−2) and a drain and a source respectively connected with the (n−2)th-stage horizontal scan line G(n−2) and the gate signal point Q(n). The thin film transistor T11 controls transfer of a (n−2)th-stage GOA signal to the nth-stage GOA circuit, allowing the GOA circuits to charge and discharge in a stage by stage manner.

The boost capacitor Cb is connected between Q(n) and G(n), allowing for boosting of the voltage of Q(n) through the coupling effect of Cb when voltage of G(n) is raised, thereby obtaining a higher voltage of Q(n) and a reduced RC delay of the GOA charging signal.

The pull-down holding part 300 comprises a group of thin-film transistors, which keep the low voltages of G(n) and Q(n) during a non-charge period of the GOA circuit. A thin film transistor T32 has a gate connected with a first circuit point P and a drain and a source respectively connected with the nth-stage horizontal scan line G(n) and receiving an input of the direct current low voltage VSS. A thin film transistor T33 has a gate connected with a second circuit point K and a drain and a source respectively connected with the nth horizontal scan line G(n) and receiving an input of the direct current low voltage VSS. A thin film transistor T52 has a gate connected with the gate signal point Q(n) and a drain and a source respectively connected with the first circuit point P and receiving an input of the direct current low voltage VSS. A thin film transistor 62 has a gate connected with the gate signal point Q(n) and a drain and a source respectively connected with the second circuit point K and receiving an input of the first direct current low voltage VSS. A thin film transistor T43 has a drain and a source respectively connected with the gate signal point Q(n) and nth-stage horizontal scan line G(n). A thin film transistor T42 has a drain and a source respectively connected with the nth-stage clock signal CK(n) and a gate of the thin film transistor T43. A thin film transistor T72 has a gate receiving an input of a first clock signal LC1 and a drain and a source respectively connected with a gate of the thin film transistor T42 and the first circuit point P. A thin film transistor T73 has a gate receiving an input of a second clock signal LC2 and a drain and a source respectively connected with the gate of the thin film transistor T42 and the second circuit point K. A thin film transistor T12 has a gate receiving an input of the first clock signal LC1 and a drain and a source respectively receiving an input of the first clock signal LC1 and connected with the gate of the thin film transistor T42. A thin film transistor T13 has a gate receiving an input the second clock signal LC2 and a drain and a source respectively receiving an input of the second clock signal LC2 and connected with the gate of the thin film transistor T42. The direct current low voltage VSS can be connected with a low voltage level or ground. In operation, the nth clock signal CK(n), the first clock signal LC1, and the second clock signal LC2 are input and the frequencies of the first clock signal LC1 and the second clock signal LC2 are lower than that of the nth-stage clock signal CK(n). Moreover, the first clock signal LC1 charging the first circuit point P and the second clock signal LC2 charging the second circuit point K are alternately carried out.

The circuit points P and K are alternately charged by the low frequency clock signals LC1 and LC2 to be set at high voltages, thereby alternately controlling the thin film transistors T32 and T33 to turn on, in order to keep the low voltage of G(n) at a non-charge period and prevent the thin film transistors T32 or T33 from be long affected by gate voltage stress. The thin film transistor T52 is connected with P and receives an input of the direct current low voltage VSS and the thin film transistor T62 is connected with pint K and receives an input of the direct current low voltage VSS. The transistors T52 and T62 may turn on, when Q(n) is in a high voltage, to pull down the voltages of points P and K in order to turn off T32 and T33, preventing them from affecting charging. During the non-charging period, the thin film transistors T12 and T72 or T13 and T73 are turned on, point P or K is in a high voltage, and therefore, the gate of the thin film transistor T42 is in a high voltage and the high frequency clock signal CK(n) periodically turns on the thin film transistor T43 in order to keep Q(n) in a low voltage. During the charging period, after Q(n) is charged to a high voltage, T52 or T62 is turned on; the gate voltage of T42 is pulled down, making T42 off, T43 being prevented from turning on. Thus, the leakage current of Q(n) flowing through T43 decreases, improving the stability of the voltage of Q(n).

The GOA circuit of the present invention can precisely control the voltages of the gate Q(n) of the thin film transistor in a charging period and a non-charging period, which affect the charging of the horizontal scan lines through the low frequency clock signal and the high frequency clock signal, so as to ensure a stable output of the GOA charging signal. Specifically, (1) during the non-charging period, the thin film transistor T42 that is connected with the high frequency clock signal CK(n) and the thin film transistor T43 is on so that the high frequency clock signal CK(n) can periodically turn on the thin film transistor T43 in order to keep Q(n) at a low voltage; and (2) during the charging period, after Q(n) is charged to a high voltage, the thin film transistors T42 and T43 are turned off so that the leakage current of Q(n) flowing through T43 can be reduced.

Figure 2:
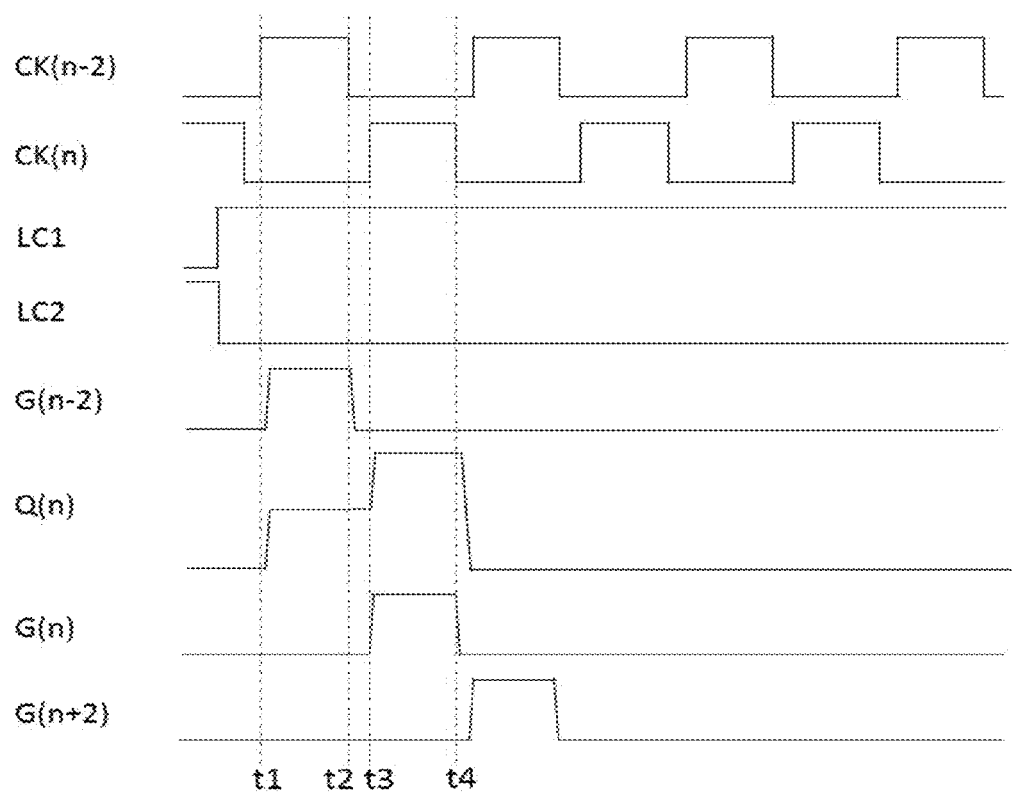
FIG. 2 is a schematic view showing output waveforms of the GOA circuit for liquid crystal displaying according to the present invention at a normal temperature.

Referring to FIG. 2, a schematic view is given to show output waveforms of the GOA circuit for liquid crystal displaying according to the present invention at a normal temperature, wherein the duty ratio of the high frequency clock signal is 40%. In FIG. 2, t1-t3 is a preparing period of time before G(n) is charged; t3-t4 is the charging period of G(n); and after t4, G(n) is discharged. The low frequency clock signals LC1 and LC2 can be selected to have the same frequency, but opposite phases. Further understanding of FIG. 2 can be made with reference to FIG. 1, where at t1, the voltage of CK(n-2) begins rising and the voltage of G(n-2) also begins rising; and the thin film transistor T11 is turned on to charge Q(n). After the voltage of Q(n) rises, the thin film transistors T52 and T62 are turned on, thereby shutting off T32, T42, T33, and T43 to prevent them from affecting the charging of Q(n) and G(n) affected. At t2, the voltage of CK(n-2) begins reducing, but the arrangement of connection of the thin film transistor T11 helps avoid the leakage current of Q(n), so that the voltage of Q(n) essentially maintains the same. At t3, the voltage of CK(n) begins rising and the thin film transistor T21 is turned on, so that Q(n) boosts to a higher voltage and controls T21 to charge G(n). At t4, CK(n) begins reducing but the voltage of Q(n) is not pulled down immediately, so that the thin film transistor T21 still maintains on for a short period of time after t4 in order to pull down the voltage of G(n). After that, the voltage of G(n+2) begins rising and the thin film transistors T31 and T41 are turned on so as to ensure the voltages of G(n) and Q(n) are pulled down. T52 and T62 are turned off after the voltage of Q(n) is pulled down. In summary, the present invention can precisely control the voltage of Q(n) through the low frequency clock signal and the high frequency clock signal, ensuring a stable output of the GOA charging signal.

Figure 3:
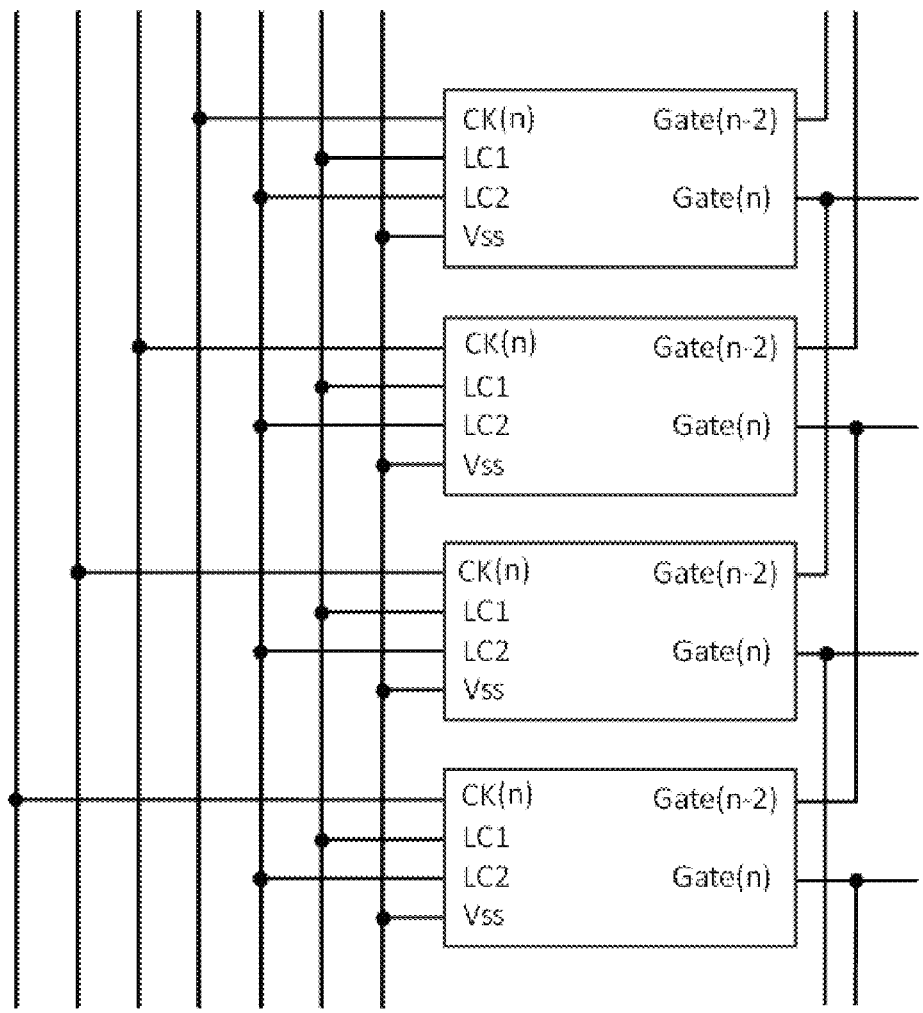
FIG. 3 is a schematic view showing a multi-stage architecture of a GOA circuit for liquid crystal displaying according to the present invention.

Referring to FIG. 3, a schematic view is given to show a multi-stage architecture of a GOA circuit for liquid crystal displaying according to the present invention. FIG. 3 provides a multi-stage architecture of a GOA circuit according to the present invention, in which metal wires for transmitting the low frequency clock signals LC1 and LC2, the direct current low voltage VSS, and the four high frequency clock signals CK1-CK4 are placed outside each stage GOA circuit (of which the specific arrangement of connection is shown in FIG. 1). The low frequency clock signal LC1, the low frequency clock signal LC2, and the direct current low voltage VSS are respectively supplied through the common metal wires of their own to the plurality of cascaded GOA units. In the present embodiment, the nth-stage GOA circuit receives LC1, LC2, VSS, one CK signal of CK1-CK4, G(n-2) generated by the (n-2)th-stage GOA circuit, and G(n+2) generated by the (n+2)th-stage GOA circuit and generates G(n) signal. The connection among the stages of GOA circuit shown in FIG. 3 ensures the GOA signal can be transmitted stage by stage, so that the horizontal scan lines of the stages can be charged and discharged in a stage-wise manner. For the GOA units of the first and last stages, an activation signal can be applied to replace the missing input of G(n) signal.

The GOA circuit according to the present invention can use an existing manufacturing process of a liquid crystal display panel to form a driving circuit of the horizontal scan lines of the panel on a substrate surrounding a display region, making it possible to replace the external IC for driving each stage horizontal scan line of the liquid crystal display panel. The present invention is particularly suitable for producing a liquid crystal display panel having a slim bezel or no bezel.

Figure 4:
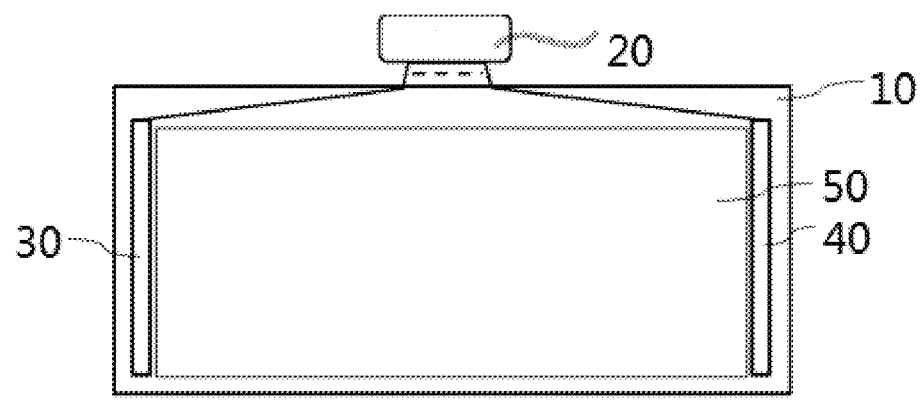
FIG. 4 is a schematic view showing the structure of a liquid crystal display device to which a GOA circuit for liquid crystal displaying according to the present invention is applied.

Referring to FIG. 4, a schematic view is given to show the structure of a liquid crystal display device to which a GOA circuit for liquid crystal displaying according to the present invention is applied. In FIG. 4, a liquid crystal display device comprises a display substrate 10. A driving control panel 20 is mounted on the top of the display substrate 10 to provide drive and control signals to the display substrate 10. A left region 30 and a right region 40 of the display substrate 10 comprises GOA circuits formed thereon to allow for driving of the horizontal scan lines of the driving display region 50 from the left side and the right side. The GOA circuits receive an input signal from the driving control panel 20 and generates a control signal for the horizontal scan line is a stage by stage manner so as to control the pixels of the display region 50 to activate line by line.

In summary, the GOA circuit for liquid crystal displaying and the display device according to the present invention can precisely control the voltage of the gate Q(n) of the thin film transistor affecting charging of the horizontal scan line in a charging period and a non-charging period by means of the low frequency clock signal and the high frequency clock signal, thereby ensuring a stable output of the GOA charging signal. Utilizing the GOA circuit of the present invention make it possible to produce a liquid crystal display device having a slim bezel or no bezel with a low cost.

The preferred embodiments according to the present invention are mentioned above, which cannot be used to define the scope of the right of the present invention. Those modifications and variations are considered encompassed in the scope of protection defined by the claims of the present invention.

What is claimed is:

1. A GOA (Gate Driver on Array) circuit for liquid crystal displaying, comprising a plurality of cascaded GOA units, in which a nth-stage GOA control unit controls charging of a nth-stage horizontal scan line of a display region and the nth-stage GOA unit comprises a pull-up part, a key pull-down part, a pull-down holding part, a pull-up control part, and a boost capacitor, the pull-up part, the key pull-down part, the pull-down holding part, and the boost capacitor being connected with a gate signal point and the nth-stage horizontal scan line, the pull-up control part being connected with the gate signal point;

wherein the key pull-down part comprises:
- a first thin film transistor, which has a gate connected with a first circuit point and a drain and a source respectively connected with the nth horizontal scan line and receiving an input of a direct current low voltage;
- a second thin film transistor, which has a gate connected with a second circuit point and a drain and a source respectively connected with the nth horizontal scan line and receiving an input of the direct current low voltage;
- a third thin film transistor, which has a gate connected with the gate signal point and a drain and a source respectively connected with the first circuit point and receiving an input of the direct current low voltage;
- a fourth thin film transistor, which has a gate connected with the gate signal point and a drain and a source respectively connected with the second circuit point and receiving an input of the direct current low voltage;
- a fifth thin film transistor, which has a drain and a source respectively connected with the gate signal point and the nth horizontal scan line;
- a sixth thin film transistor, which has a drain and a source respectively receiving an input of a nth-stage clock signal and connected with a gate of the fifth thin film transistor;
- a seventh thin film transistor, which has a gate receiving an input of a first clock signal and a drain and a source respectively connected with a gate of the sixth thin film transistor and the first circuit point;
- an eighth thin film transistor, which has a gate receiving an input of a second clock signal and a drain and a source respectively connected with the gate of the sixth thin film transistor and the second circuit point;
- a ninth thin film transistor, which has a gate receiving an input of the first clock signal and a drain and a source respectively receiving an input of the first clock signal and connected with the gate of the sixth thin film transistor; and
- a tenth thin film transistor, which has a gate receiving an input of the second clock signal and a drain and a source respectively receiving an input of the second clock signal and connected with the gate of the sixth thin film transistor;

whereby in operation, frequencies of the first clock signal and the second clock signal are set lower than the nth clock signal and the first clock signal charging the first circuit point and the second clock signal charging the second circuit point are alternately carried out.

2. The GOA circuit for liquid crystal displaying as claimed in claim 1, wherein the pull-up part comprises: an eleventh thin film transistor, which has a gate connected with the gate signal point and a drain and a source respectively receiving an input of the nth-stage clock signal and connected with the nth-stage horizontal scan line.

3. The GOA circuit for liquid crystal displaying as claimed in claim 1, wherein the key pull-down part comprises: a twelfth thin film transistor, which has a gate connected with a (n+2)th-stage horizontal scan line and a drain and a source respectively connected with the nth-stage horizontal scan line and receiving an input of the direct current low voltage; and a thirteenth thin film transistor, which has a gate connected with the (n+2)th-stage horizontal scan line and a drain and a source respectively connected with the gate signal point and receiving an input of the direct current low voltage.

4. The GOA circuit for liquid crystal displaying as claimed in claim 1, wherein the pull-up control part comprises: a fourteenth thin film transistor, which has a gate connected with a (n−2)th-stage horizontal scan line and a drain and a source respectively connected with the (n−2)th-stage horizontal scan line and the gate signal point.

5. The GOA circuit for liquid crystal displaying as claimed in claim 1, wherein the nth-stage clock signal has a duty ratio of 40%.

6. The GOA circuit for liquid crystal displaying as claimed in claim 1, wherein the first clock signal is supplied via a common metal wire to the plurality of cascaded GOA units.

7. The GOA circuit for liquid crystal displaying as claimed in claim 1, wherein the second clock signal is supplied via a common metal wire to the plurality of cascaded GOA units.

8. The GOA circuit for liquid crystal displaying as claimed in claim 1, wherein the direct current low voltage signal is supplied via a common metal wire to the plurality of cascaded GOA units.

9. A display device, which comprises a GOA circuit for liquid crystal displaying according to claim 1.

10. A GOA (Gate Driver on Array) circuit for liquid crystal displaying, comprising a plurality of cascaded GOA units, in which a nth-stage GOA control unit controls charging of a nth-stage horizontal scan line of a display region and the nth-stage GOA unit comprises a pull-up part, a key pull-down part, a pull-down holding part, a pull-up control part, and a boost capacitor, the pull-up part, the key pull-down part, the pull-down holding part, and the boost capacitor being connected with a gate signal point and the nth-stage horizontal scan line, the pull-up control part being connected with the gate signal point;

wherein the key pull-down part comprises:
- a first thin film transistor, which has a gate connected with a first circuit point and a drain and a source respectively connected with the nth horizontal scan line and receiving an input of a direct current low voltage;
- a second thin film transistor, which has a gate connected with a second circuit point and a drain and a source respectively connected with the nth horizontal scan line and receiving an input of the direct current low voltage;
- a third thin film transistor, which has a gate connected with the gate signal point and a drain and a source respectively connected with the first circuit point and receiving an input of the direct current low voltage;
- a fourth thin film transistor, which has a gate connected with the gate signal point and a drain and a source respectively connected with the second circuit point and receiving an input of the direct current low voltage;

a fifth thin film transistor, which has a drain and a source respectively connected with the gate signal point and the nth horizontal scan line;

a sixth thin film transistor, which has a drain and a source respectively receiving an input of a nth-stage clock signal and connected with a gate of the fifth thin film transistor;

a seventh thin film transistor, which has a gate receiving an input of a first clock signal and a drain and a source respectively connected with a gate of the sixth thin film transistor and the first circuit point;

an eighth thin film transistor, which has a gate receiving an input of a second clock signal and a drain and a source respectively connected with the gate of the sixth thin film transistor and the second circuit point;

a ninth thin film transistor, which has a gate receiving an input of the first clock signal and a drain and a source respectively receiving an input of the first clock signal and connected with the gate of the sixth thin film transistor; and a tenth thin film transistor, which has a gate receiving an input of the second clock signal and a drain and a source respectively receiving an input of the second clock signal and connected with the gate of the sixth thin film transistor;

whereby in operation, frequencies of the first clock signal and the second clock signal are set lower than the nth clock signal and the first clock signal charging the first circuit point and the second clock signal charging the second circuit point are alternately carried out;

wherein the pull-up part comprises: an eleventh thin film transistor, which has a gate connected with the gate signal point and a drain and a source respectively receiving an input of the nth-stage clock signal and connected with the nth-stage horizontal scan line; and wherein the key pull-down part comprises: a twelfth thin film transistor, which has a gate connected with a (n+2)th-stage horizontal scan line and a drain and a source respectively connected with the nth-stage horizontal scan line and receiving an input of the direct current low voltage; and a thirteenth thin film transistor, which has a gate connected with the (n+2)th-stage horizontal scan line and a drain and a source respectively connected with the gate signal point and receiving an input of the direct current low voltage.

11. The GOA circuit for liquid crystal displaying as claimed in claim 10, wherein the pull-up control part comprises: a fourteenth thin film transistor, which has a gate connected with a (n−2)th-stage horizontal scan line and a drain and a source respectively connected with the (n−2)th-stage horizontal scan line and the gate signal point.

12. The GOA circuit for liquid crystal displaying as claimed in claim 10, wherein the nth-stage clock signal has a duty ratio of 40%.

13. The GOA circuit for liquid crystal displaying as claimed in claim 10, wherein the first clock signal is supplied via a common metal wire to the plurality of cascaded GOA units.

14. The GOA circuit for liquid crystal displaying as claimed in claim 10, wherein the second clock signal is supplied via a common metal wire to the plurality of cascaded GOA units.

15. The GOA circuit for liquid crystal displaying as claimed in claim 10, wherein the direct current low voltage signal is supplied via a common metal wire to the plurality of cascaded GOA units.

* * * * *